United States Patent
Chang et al.

(10) Patent No.: US 8,372,523 B2
(45) Date of Patent: *Feb. 12, 2013

(54) COATED ARTICLE

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Cong Li, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/215,669

(22) Filed: Aug. 23, 2011

(65) Prior Publication Data

US 2012/0164481 A1    Jun. 28, 2012

(30) Foreign Application Priority Data

Dec. 27, 2010   (CN) .......................... 2010 1 0607434

(51) Int. Cl.
*B32B 15/04*   (2006.01)
*B32B 15/18*   (2006.01)
*B32B 18/00*   (2006.01)

(52) U.S. Cl. ........ 428/627; 428/610; 428/680; 428/684; 428/685; 428/212; 428/215; 428/336

(58) Field of Classification Search .................. 428/627, 428/610, 666, 667, 679, 680, 684, 685, 212, 428/213, 215, 216, 220, 332, 334, 335, 336, 428/938

See application file for complete search history.

(56) References Cited

U.S. PATENT DOCUMENTS

| | | | | |
|---|---|---|---|---|
| 3,837,894 A | * | 9/1974 | Tucker, Jr. | 427/419.2 |
| 4,405,660 A | * | 9/1983 | Ulion et al. | 427/248.1 |
| 6,129,988 A | * | 10/2000 | Vance et al. | 428/469 |
| 6,399,216 B1 | * | 6/2002 | Jayaweera et al. | 428/610 |
| 2012/0164482 A1 | * | 6/2012 | Chang et al. | 428/667 |

* cited by examiner

*Primary Examiner* — Michael La Villa
(74) *Attorney, Agent, or Firm* — Altis Law Group, Inc.

(57) ABSTRACT

A coated article is described. The coated article includes a stainless steel substrate, a bonding layer formed on the substrate, and a hard layer formed on the bonding layer. The bonding layer is a nickel-chromium alloy layer. The hard layer is a nickel-chromium-boron-nitrogen layer. The mass percentage of nitrogen within the hard layer is gradually increased from the area near the bonding layer to the area away from the bonding layer. A method for making the coated article is also described.

9 Claims, 2 Drawing Sheets

COATED ARTICLE

CROSS-REFERENCE TO RELATED APPLICATIONS

This application is related to U.S. Patent Application (U.S. Ser. No. 13/215672, Pending), entitled "COATED ARTICLE AND METHOD FOR MAKING SAME", invented by Chang et al. The application has the same assignee as the present application. The above-identified application is incorporated herein by reference.

BACKGROUND

1. Technical Field

The present disclosure relates to a coated article and a method for making the coated article.

2. Description of Related Art

Transition metal compounds, such as carbide, nitride, and carbonitride can be coated on stainless steel articles, such as device housings and glasses frames to prolong the service life of the articles due to having many good properties such as high hardness, high abrasion resistance, and good chemical durability. However, coatings made of such compounds poorly bond to stainless steel substrates because the stainless steel substrates have a high coefficient of thermal expansion compared to most transition metal compounds that may be used to form coatings on the stainless steel substrate.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
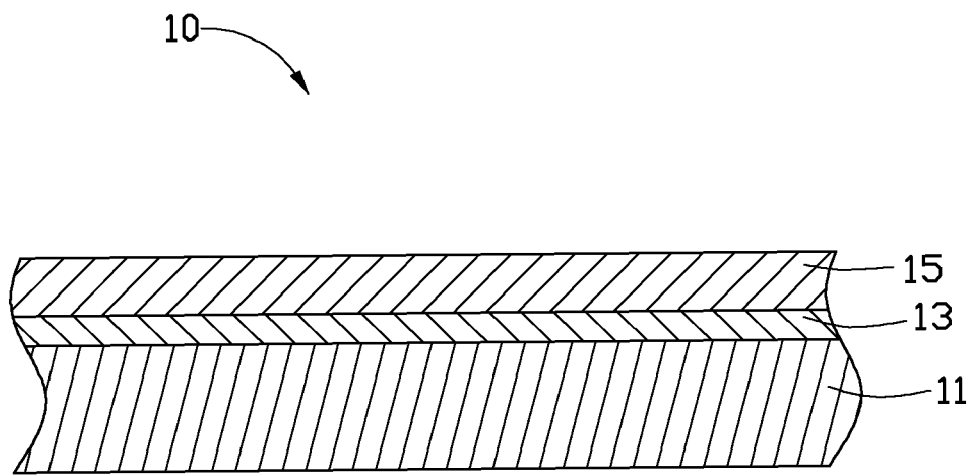
FIG. 1 is a cross-sectional view of an exemplary embodiment of a coated article.

FIG. 1 shows a coated article 10 according to an exemplary embodiment. The coated article 10 includes a substrate 11, a bonding layer 13 formed on a surface of the substrate 11, and a hard layer 15 formed on the bonding layer 13.

The substrate 11 can be made of a stainless steel.

The bonding layer 13 is a nickel-chromium (NiCr) alloy layer and may be formed by vacuum sputtering, such as magnetron sputtering. The nickel in the bonding layer 13 may have a mass percentage of about 20%-80%. The bonding layer 13 may have a thickness of about 100 nm-300 nm. The bonding layer 13 enhances the bond between the hard layer 15 and the substrate 11.

The hard layer 15 may be formed by vacuum sputtering, such as magnetron sputtering. The hard layer 15 is a nickel-chromium-boron-nitrogen (NiCrBN) layer, in which the mass percentage of the nitrogen gradually increases from the area near the bonding layer 13 (or the substrate 11) to the area away from the bonding layer 13 (or the substrate 11). The hard layer 15 may have a thickness of about 1 μm-4 μm.

In the hard layer 15, the nickel has a mass percentage of about 20%-30%, the chromium has a mass percentage of about 30%-45%, the boron has a mass percentage of about 5%-10%, and the nitrogen has a mass percentage of about 20%-40%.

The bonding layer 13 comprises nickel-chromium alloy. Nickel and chromium are also found in the substrate 11. Thus, the bonding layer 13 has a high bonding force with the substrate 11. Furthermore, the mass percentage of the nitrogen within the hard layer 15 is gradually increased from the bottom of the hard layer 15 near the bonding layer 13 (or the substrate 11) to the top of the hard layer 15 away from the bonding layer 13 (or the substrate 11). As such, the coefficients of thermal expansion of the hard layer 15 is gradually increased from the bottom of the hard layer 15 to the top of the hard layer 15, such coefficient change of thermal expansion reduces the coefficient difference between the bonding layer 13 and the hard layer 15, which improves the bond between each of the layers of the coated article 10.

Additionally, the gradually increasing content of the nitrogen in the hard layer 15 increases the content of a boron-nitrogen compound phase in the hard layer 15. The boron-nitrogen compound has a high hardness, thus enhances the hardness of the hard layer 15, which further provides the coated article 10 good abrasion resistance.

A method for making the coated article 10 may include the following steps:

The substrate 11 is pre-treated. The pre-treating process may include the following steps.

The substrate 11 is cleaned in an ultrasonic cleaning device (not shown) filled with ethanol or acetone.

Figure 2:
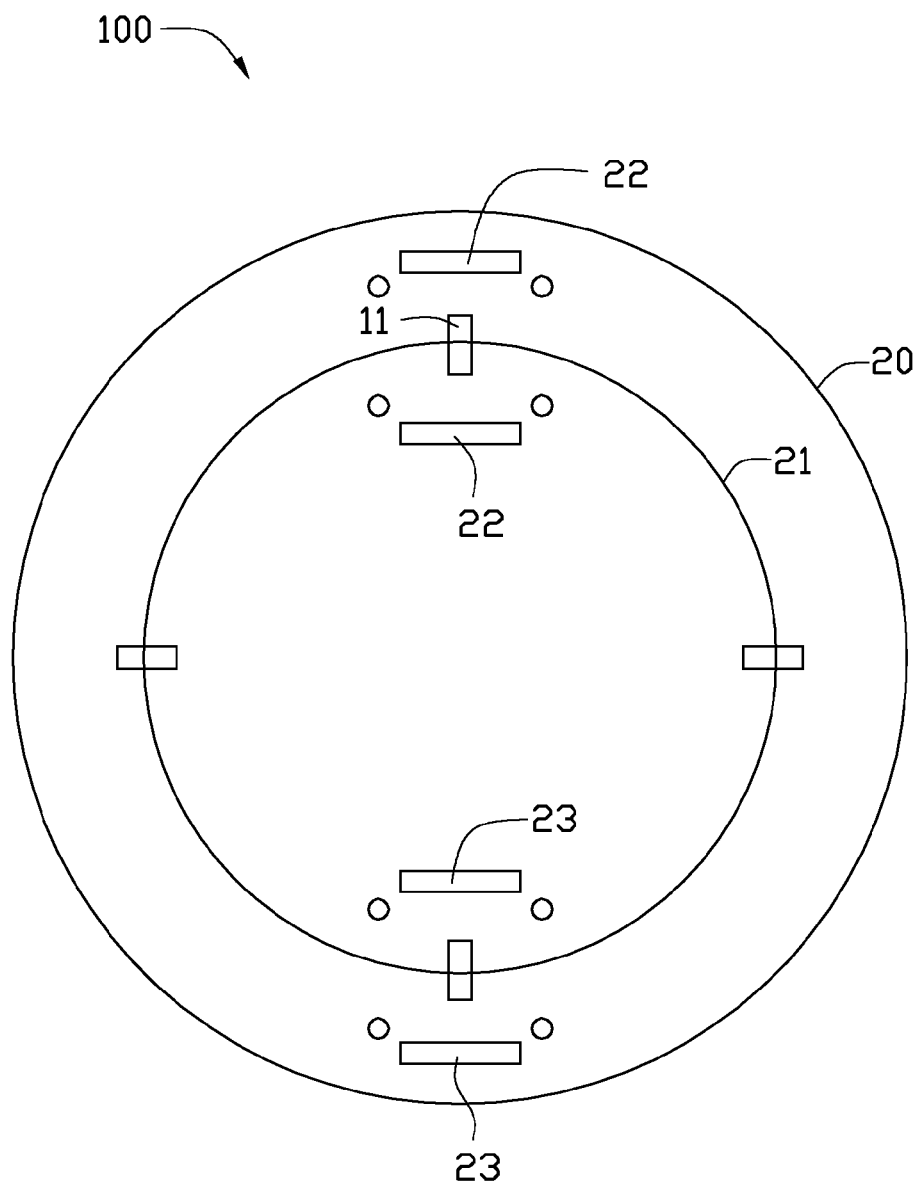
FIG. 2 is a schematic view of an exemplary embodiment of a vacuum sputtering device.

The substrate 11 is plasma cleaned. Referring to FIG. 2, the substrate 11 may be held on a rotating bracket 21 in a vacuum chamber 20 of a vacuum sputtering device 100. Nickel-chromium alloy targets 22 and boron targets 23 are fixed in the vacuum chamber 20. The nickel-chromium alloy targets 22 contain about 20%-80% of nickel by weight. The vacuum chamber 20 is then evacuated to about $3.0 \times 10^{-3}$ Pa. Argon gas having a purity of about 99.999% may be used as a sputtering gas and is fed into the vacuum chamber 20 at a flow rate of about 400 standard-state cubic centimeters per minute (sccm) to 600 sccm. A bias voltage of about −500 V to about −800 V is applied to the substrate 11. Argon gas is ionized to plasma. The plasma then strikes the surface of the substrate 11 to clean the surface of the substrate 11. The plasma cleaning process may take about 3 minutes (min) to 10 min. The plasma cleaning process enhances the bond between the substrate 11 and the layers of the coated article 10. The nickel-chromium alloy targets 22 and boron targets 23 are unaffected by the plasma cleaning process.

The bonding layer 13 may be magnetron sputtered on the pretreated substrate 11. Magnetron sputtering of the bonding layer 13 is implemented in the vacuum chamber 20. The internal temperature of the vacuum chamber 20 may be of about 100° C.-200° C. Argon gas may be used as a sputtering gas and is fed into the vacuum chamber 20 at a flow rate of about 200 sccm-400 sccm. A bias voltage of about −100 V to about −300 V is applied to substrate 11. About 8 kW-10 kW of power at an intermediate frequency is then applied to the nickel-chromium alloy targets 22, depositing the bonding layer 13. Depositing of the bonding layer 13 may take about 20 min-60 min.

The hard layer 15 may be magnetron sputtered on the bonding layer 13. Magnetron sputtering of the hard layer 15 is implemented in the vacuum chamber 20. The internal temperature of the vacuum chamber 20 may be of about 100° C.-200° C. Argon may be used as a sputtering gas and is fed into the vacuum chamber 20 at a flow rate of about 300 sccm-500 sccm, and nitrogen may be used as a reaction gas and is fed into the vacuum chamber 20 at an initial flow rate of about 10 sccm-20 sccm. A bias voltage of about −100 V to about −300 V is applied to substrate 11. About 8 kW-10 kW of power at an intermediate frequency is then applied to the nickel-chromium alloy targets 22, and about 3 kW-10 kW of power at an intermediate frequency is then applied to the boron targets 23, depositing the hard layer 15 on the bonding layer 13. During the deposition process, the flow rate of the nitrogen increases at a rate of about 5 sccm-15 sccm per 1 min-5 min, until achieving a peak range of about 50 sccm-150 sccm. Depositing of the hard layer 15 may take about 30 min-120 min.

When depositing the hard layer 15, the nickel and chromium atoms are sputtered off from the nickel-chromium targets 22. Boron atoms are sputtered off from the boron targets 23, and nitrogen are ionized in the vacuum chamber 20. The ionized nickel and chromium atoms then chemically react with the ionized nitrogen to deposit a nickel-chromium-nitrogen compound phase. The ionized boron atoms react with the ionized nitrogen to deposit a boron-nitrogen compound phase. The boron-nitrogen compound phase has a high hardness and enhances the hardness of the hard layer 15.

Specific examples of making the coated article 10 are described as following.

The ultrasonic cleaning in these specific examples may be substantially the same as described above so it is not described here again. The specific examples mainly emphasize the different process parameters of making the coated article 10.

EXAMPLE 1

Plasma cleaning the substrate 11 made of SUS304: the internal pressure of the vacuum chamber is about $3.0\times10^{-3}$ Pa; the flow rate of argon is 500 sccm; the substrate 11 has a bias voltage of −500 V; plasma cleaning of the substrate 11 takes 5 min.

Sputtering to form bonding layer 13 on the substrate 11: the flow rate of argon is 400 sccm; the internal temperature of the vacuum chamber 20 is 100° C.; a bias voltage of −120 V is applied to the substrate 11; about 8 kW of power at an intermediate frequency is applied to the nickel-chromium targets 22; sputtering of the bonding layer 13 takes 35 min; the nickel-chromium alloy targets 22 contains 50% of nickel by weight.

Sputtering to form hard layer 15 on the bonding layer 13: the flow rate of argon is 400 sccm, the initial flow rate of nitrogen is 20 sccm; the internal temperature of the vacuum chamber 20 is 100° C.; a bias voltage of −120 V is applied to the substrate 11; about 8 kW of power at an intermediate frequency is applied to the nickel-chromium targets 22 and about 3 kW of power at an intermediate frequency is applied to the boron targets 23; during sputtering of the hard layer 15, the flow rate of the nitrogen increases at a rate of 10 sccm per 5 min, until achieving a peak flow rate of 120 sccm; sputtering of the hard layer 15 takes 40 min.

EXAMPLE 2

Plasma cleaning the substrate 11 made of SUS409: the internal pressure of the vacuum chamber is about $3.0\times10^{-3}$ Pa; the flow rate of argon is 500 sccm; the substrate 11 has a bias voltage of −550 V; plasma cleaning of the substrate 11 takes 10 min Sputtering to form bonding layer 13 on the substrate 11: the flow rate of argon is 350 sccm; the internal temperature of the vacuum chamber 20 is 150° C.; a bias voltage of −120 V is applied to the substrate 11; about 8 kW of power at an intermediate frequency is applied to the nickel-chromium targets 22; sputtering of the bonding layer 13 takes 30 min; the nickel-chromium alloy targets 22 contains 60% of nickel by weight.

Sputtering to form hard layer 15 on the bonding layer 13: the flow rate of argon is 380 sccm, the initial flow rate of nitrogen is 10 sccm; the internal temperature of the vacuum chamber 20 is 150° C.; a bias voltage of −120 V is applied to the substrate 11; about 8 kW of power at an intermediate frequency is applied to the both of the nickel-chromium targets 22 and about 3 kW of power at an intermediate frequency is applied to the boron targets 23; during sputtering of the hard layer 15, the flow rate of the nitrogen increases at a rate of 10 sccm per 5 min, until achieving a peak flow rate of 110 sccm; sputtering of the hard layer 15 takes 35 min.

The hardness of the samples created by the example 1 and 2 was tested by a "HM-133" type Vickers hardness tester. The samples created by the example 1 and 2 had a vickers hardness of about 582 HV and 603 HV respectively, under a load of about 0.05 kg.

An abrasion test was also applied to the samples created by the example 1 and 2 using commercially available Taber abrasion tester (TABER 5700, manufactured by TABER INDUSTRIES). The surfaces of the samples were subjected to abrasion 10 cycles with a load of 1 kg, with 2 inches each cycle, and at a moving rate of about 25 cycles per minute. No substrate 11 of the samples was exposed after the abrasion.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a stainless steel substrate;
   a bonding layer formed on the substrate, the bonding layer being a nickel-chromium alloy layer; and
   a hard layer formed on the bonding layer, the hard layer being a nickel-chromium-boron-nitrogen layer essentially consisting of the elements of nickel, chromium, boron, and nitrogen;
   wherein the mass percentage of the nitrogen within the hard layer gradually increases from the area near the bonding layer to the area away from the bonding layer.

2. The coated article as claimed in claim 1, wherein in the hard layer, nickel has a mass percentage of about 20% to about 30%, chromium has a mass percentage of about 30% to about 45%, boron has a mass percentage of about 5% to about 10%, and nitrogen has a mass percentage of about 20% to about 40%.

3. The coated article as claimed in claim 1, wherein the hard layer has a thickness of about 1 μto about 4 μm.

4. The coated article as claimed in claim 1, wherein nickel in the bonding layer has a mass percentage of about 20% to about 80%.

5. The coated article as claimed in claim 1, wherein the bonding layer has a thickness of about 100 nm to about 300 nm.

6. The coated article as claimed in claim 1, wherein the bonding layer and the hard layer are both formed by vacuum sputtering.

7. The coated article as claimed in claim 6, wherein vacuum sputtering the hard layer uses nitrogen as a reaction gas, and simultaneously uses nickel-chromium alloy target and boron target.

8. The coated article as claimed in claim 7, wherein the hard layer comprises a nickel-chromium-nitrogen compound phase and a boron-nitrogen compound phase.

9. The coated article as claimed in claim 8, wherein during the vacuum sputtering of the hard layer, ionized nickel atoms and ionized chromium atoms from the nickel-chromium alloy target chemically react with ionized nitrogen atoms to deposit the nickel-chromium-nitrogen compound phase; and wherein ionized boron atoms from the boron target react with the ionized nitrogen atoms to deposit the boron-nitrogen compound phase.

\* \* \* \* \*